United States Patent
Chang et al.

(10) Patent No.: US 6,441,115 B1
(45) Date of Patent: *Aug. 27, 2002

(54) PHOTOSENSITIVE POLYMER

(75) Inventors: Shang-Wern Chang, Taipei; Yen-Cheng Li, Sanchung; Shang-Ho Lin, Taipei, all of (TW)

(73) Assignee: Everlight USA, Inc., Pineville, NC (US)

( * ) Notice: Subject to any disclaimer, the term of this patent is extended or adjusted under 35 U.S.C. 154(b) by 154 days.

This patent is subject to a terminal disclaimer.

(21) Appl. No.: 09/608,602

(22) Filed: Jun. 30, 2000

(51) Int. Cl.⁷ .............................................. C08F 220/10
(52) U.S. Cl. .................... 526/328.5; 526/258; 526/259; 526/271; 526/318; 526/318.4; 526/320; 430/270.1
(58) Field of Search ........................ 430/270.1; 526/258, 526/259, 271, 318, 318.4, 320, 328.5

(56) References Cited

U.S. PATENT DOCUMENTS

| | | | |
|---|---|---|---|
| 6,180,316 B1 * | 1/2001 | Kajita et al. | 430/270.1 |
| 6,248,499 B1 * | 6/2001 | Maeda et al. | 430/270.1 |
| 6,265,131 B1 * | 7/2001 | Chang et al. | 430/270.1 |
| 6,271,412 B1 * | 8/2001 | Chang et al. | 560/220 |
| 6,284,429 B1 * | 9/2001 | Kinsho et al. | 430/270.1 |
| 6,294,309 B1 * | 9/2001 | Chang et al. | 430/270.1 |
| 6,316,159 B1 * | 11/2001 | Chang et al. | 430/270.1 |

* cited by examiner

*Primary Examiner*—Helen L. Pezzuto
(74) *Attorney, Agent, or Firm*—Bacon & Thomas

(57) ABSTRACT

The present invention provides a photosensitive polymer containing the following structure unit of formula (II):

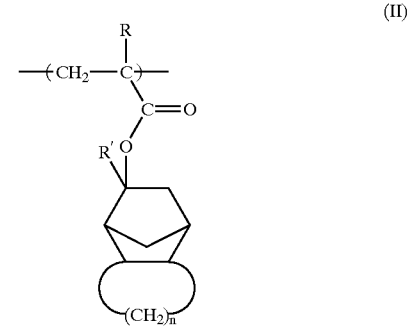

Wherein R is hydrogen or $C_1$–$C_4$ alkyl group; R' is $C_1$–$C_4$ alkyl group; n is an integer of 2, 3, 4, 5 or 6. This photosensitive polymer also relates to chemical amplified photoresist composition. This chemical amplified photoresist composition can be applied to general lithography processes, especially in 193 nm lithography and the patterns formed from the photoresist composition exhibit excellent resolution and photosensitivity.

22 Claims, No Drawings

PHOTOSENSITIVE POLYMER

FIELD OF THE INVENTION

The present invention relates to a photosensitive polymer. Especially relates to a photosensitive polymer for using in the chemical amplified photoresist composition.

BACKGROUND OF THE INVENTION

Current semiconductor industry trends indicate that availability of lithography below 0.18 μm is required for the development of high performance logic processors and 1-Gbit DRAM. In theory, there are two possible ways to get resist patterns with finer resolution, i.e. to shorten the wavelength of exposure light sources and to enlarge the numerical aperature (NA) of exposure systems.

KrF excimer laser (248 nm) steppers are widely used for the 0.25 μm UV lithography manufacturing process of semiconductor devices. Due to the improvement of optical elements such as high NA optical elements, phase shift mask, etc., the 248 nm KrF scanners now are capable of offering pilot run of 0.18 μm process and pioneer development of below 0.15 um process. However, since there is a limit for wavelength shortening, the processing or manufacturing of finer masks becomes more and more difficult. To meet the urge demand of minimizing the size of IC devices, development of 193 nm (ArF excimer laser) lithography and resists are recognized as an alternative resolution recently.

Unfortunately, due to the strong absorption of aromatic rings that provides dry-etch resistance, the conventional chemical amplified resists based on phenol resin (248 nm) are totally opaque at 193 nm. To solve the problems, new polymers that exhibit low optical density at 193 nm are in great need now.

Generally speaking, the polymer which is adequate candidate for the photoresist for 193 nm lithography is required to meet six basic requirements:

(1) high transparency for 193 nm light source;
(2) good thermoplastic, ex. High glass transition temperature (Tg);
(3) high etch resistance;
(4) good adhesion and development for its composition;
(5) contained acid labile functional groups;
(6) be applied to general processes.

Recently, a tetrapolymer iBMA-MMA-tBMA-MMA (poly isobornyl methacrylate-methyl methacrylate -t-butyl methacrylate-methacrylic acid) is reported to be a possible resin system for ArF resist:

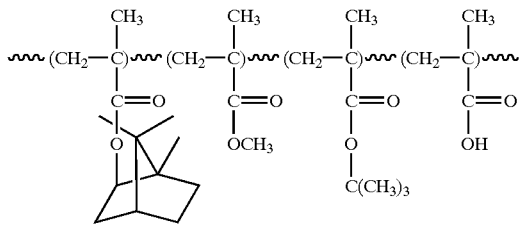

However, the tetrapolymer is also accompanied with undesirable adhesion and etch resistance. Therefore, a new resin for the compositions of resists is eager to be developed.

SUMMARY OF THE INVENTION

One object of the present invention is to provide a photosensitive polymer with excellent etch resistance, thermal properties and optical transparence at 193 nm.

The present invention provides a photosensitive polymer containing the following structure unit of formula (II):

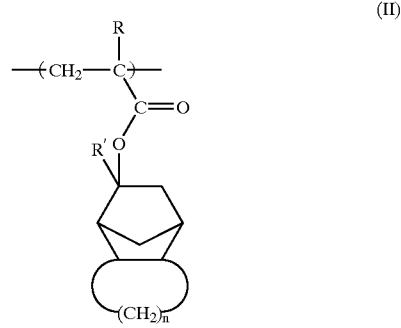

Wherein R is hydrogen or $C_1$–$C_4$ alkyl group; R' is $C_1$–$C_4$ alkyl group; n is an integer of 2, 3, 4, 5 or 6.

The photosensitive polymer can be used as components of chemical amplified photoresist compositions. The photosensitive polymer of the present invention can be optionally mixed with photo-acid generators, acid quenchers, additives or solvents to form photoresist compositions applied for general lithography process or 193nm lithographic process.

DETAILED DESCRIPTION OF THE INVENTION

The photosensitive polymer of the present invention is prepared from the following formula (I) compound:

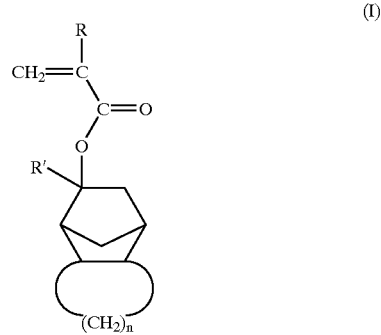

Wherein R is hydrogen or $C_1$–$C_4$ alkyl group; R' is $C_1$–$C_4$ alkyl group; n is an integer of 2, 3, 4, 5 or 6.

Preferably, compound (I) is a monomer of polycycloalkyl acrylate which can be obtained from the reaction of acryloyl chloride and tricycloalcohol or its derivatives.

Compound (I) can polymerized or copolymerized with other vinyl monomers to form various polymers or copolymers with or without the assistance of catalysts.

There is no special limit for the application of the polymers or copolymers. However, if the polymers polymerized or copolymerized from compound (I) are expected to be transparent for the radiation with 193 nm wavelength, vinyl monomers free of aromatic rings are preferred.

Vinyl monomers suitable to copolymerized with compound (I) can be

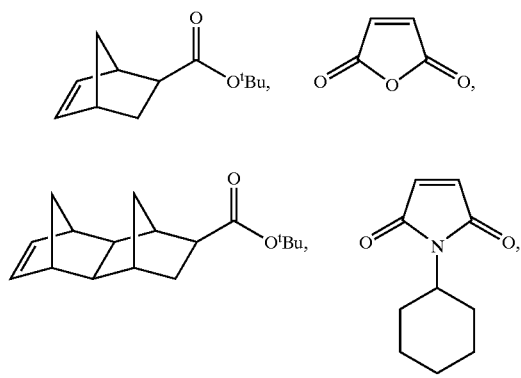
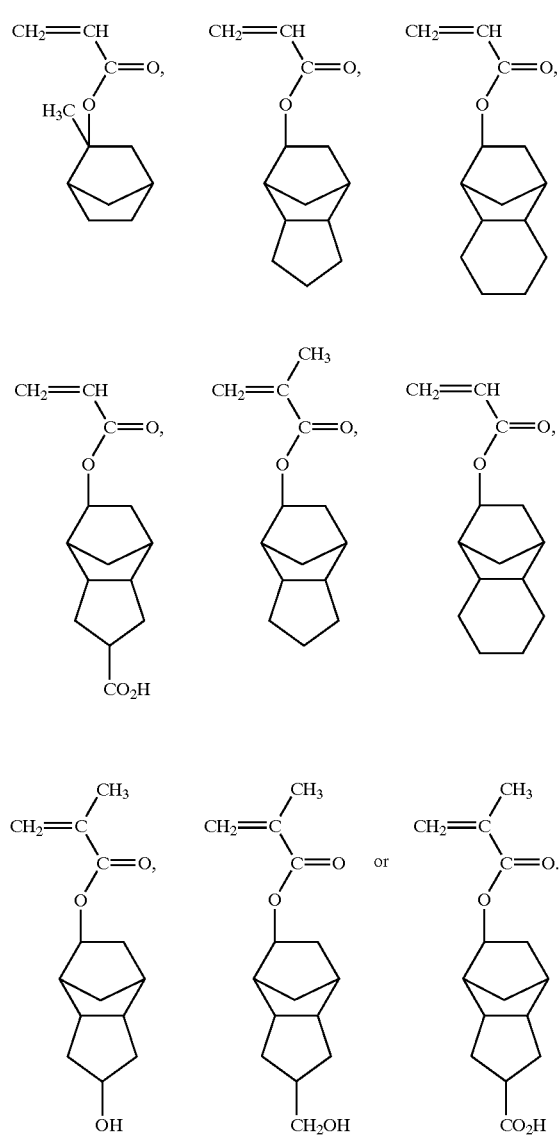
The polymers or copolymers polymerized or copolymerized from compound (I) contain the following structure unit of formula (II):
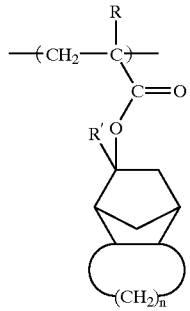
wherein R, R' and n are defined as the above.
The structure unit of the polymers or copolymers polymerized or copolymerized from compound (I) can be
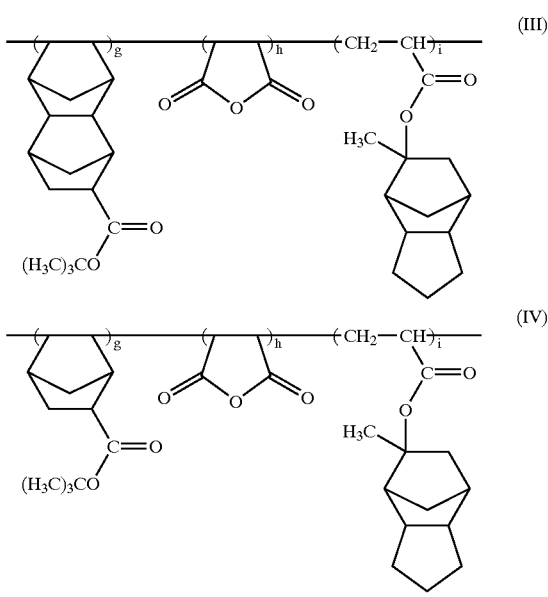
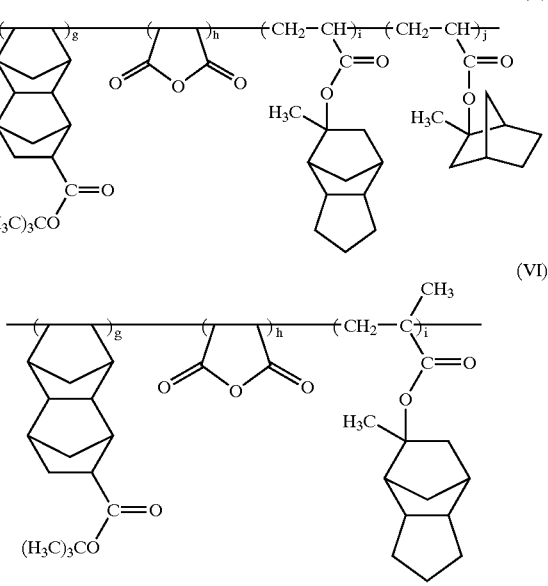

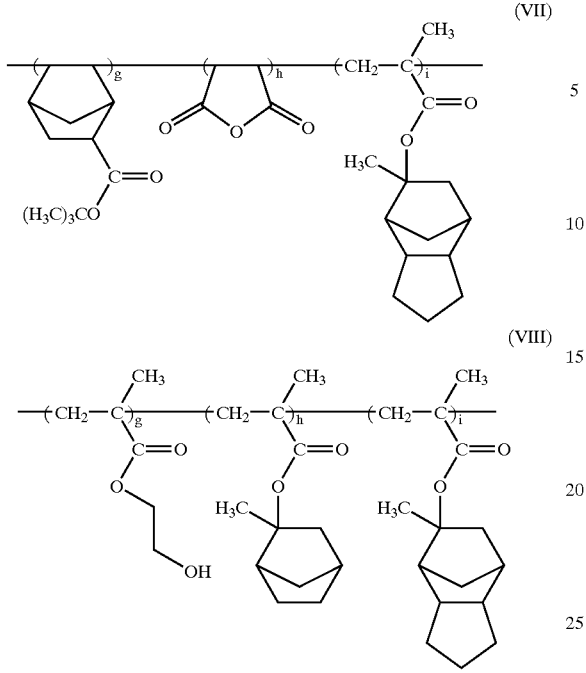

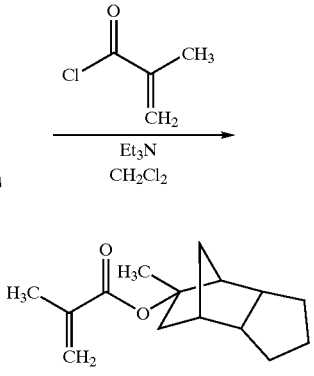

(A) Synthesis of 8-methyl-tricyclo[5.2.1.0$^{2,6}$]decan-8-ol (Formula (X))

Tricyclo[5.2.1.0$^{2,6}$]decan-8-one (15.0 g) in tetrahydrofuran (THF, 50 ml) is slowly added into CH$_3$MgCl (9.7 g) in THF and the reaction mixture is stirred completely. Tetrahydrofuran (THF, 100 ml) with 5% of water is added into the reaction mixture. Then 100 ml of water is added to the reaction mixture. The reaction mixture is extracted by ether. The organic extract is concentrated in vacuo to yield 8-methyl-tricyclo[5.2.1.0$^{2,6}$]decan-8-ol (formula (X)) as white solid.

$^1$H-NMR (CDCl$_3$, 300 MHz) δ2.60–2.45 (1H, m), 1.90–1.50 (8H, m), 1.28 (3H, s) 1.40–0.80 (5H, m).

$^{13}$C-NMR (CDCl$_3$, 75 MHz) δ76.9, 52.8, 46.8, 46.5, 41.8, 39.3, 32.7, 32.4, 31.8, 30.4, 27.4.

(B) Synthesis of 8-methyl tricyclo[5.2.1.0$^{2,6}$]decan-8-yl methacrylate (Formula (I-1))

Methacryloyl chloride (20.9 g) and triethyl amine (20.2 g) is added to 8-methyl tricyclo[5.2.1.0$^{2,6}$]deccan-8-ol (20.0 g) in dichloromethane (200 ml) and the reaction mixture is stirred completely. Then 20 ml of water is added to the reaction mixture. Separating the CH$_2$Cl$_2$ and water layers, then the water layer was extracted with CH$_2$Cl$_2$ (200 mL×3). The organic layer was combined then wash with water till pH=7, dried over MgSO$_4$ and evaporated to dryness. The residue was purified by flash column on silica gel (n-hexane), the filtrate was evaporated to obtain 8-methyl tricyclo[5.2.1.0.$^{2,6}$]decan-8-yl methacrylate. (20 g, formula (I-1))

$^1$H-NMR (CDCl$_3$, 300 MHz) δ5.95 (1H, brs), 5.41 (1H, brs), 2.35–2.00 (2H, m), 1.84 (3H, s), 1.84–1.51 (8H, m), 1.47 (3H, s), 1.46–0.80 (6H, m).

$^{13}$C-NMR (CDCl$_3$, 75 MHz) δ166.5, 137.4, 124.2, 86.4, 51.4, 46.6, 45.0, 40.6, 39.8, 32.4, 31.6, 31.1, 27.2, 25.5, 18.3.

in the above structure unit of formula (III), (IV), (VI), (VII) and (VIII), wherein g+h+i=1, more preferably g/(g+h+i)= 0.1–0.5, h/(g+h+i)=0.1–0.5, and i/(g+h+i)=0.1–0.5; in the above structure unit of formula (V), wherein g+h+i+j=1, more preferably g/(g+h+i+j)=0.1–0.5, h/(g+h+i+j)=0.1–0.5, i/(g+h+i+j)=0.1–0.5, and j/(g+h+i+j)=0.1–0.5.

There is no special limit for the synthetical method of the polymers or copolymers from compound (I) of the present invention. Preferably, the polymerization or copolymerization of compound (I) or its mixture is initiated by initiators. Initiator used here can be any initiator used by the people who is skilled in the art. Preferably, the initiator is 2,2'-azo-bis-isobutyronitrile(AIBN) or dimethyl-2,2'-azo-bis-isobutyrate radical initiator (V-601)

The polymers or copolymers of present invention can combine with adequate photo-acid generator (PAG), acid quencher, additives or solvent to form chemical amplified photoresist compositions. The chemical amplified photoresist composition of the present invention can be used in the process of lithography. Especially, the chemical amplified photoresist composition of the present invention can be used in the process of 193 nm (ArF excimer laser) lithography.

More detailed examples are used to illustrate the present invention, and these examples are used to explain the present invention. The examples below, which are given simply by way of illustration, must not be taken to limit the scope of the invention.

Preparation Example 1

Synthesis of 8-methyl tricyclo[5.2.1.0$^{2,6}$]decan-8-yl methylacrylate (Formula (I-1))

Preparation Example 2

Synthesis of 8-methyl tricyclo[5.2.1.0$^{2,6}$]decan-8-yl acryloylate) (formula (I-2))

The procedure is as same as that of example 1 except methacryloyl chloride is replaced by acryloyl chloride (18.1 g). The product 8-methyl-tricyclo[5.2.1.0$^{2,6}$]decan-8-yl acrylate (18.5 g) (formula (I-2)) as colorless oil is obtained.

$^1$H-NMR (CDCl$_3$, 300 MHz) δ6.19 (1H, dd, 17.3, 1.74), 5.90 (1H, dd, 17.3, 10.3), 5.61 (1H, dd, 10.3, 1.74), 2.29–1.44 (8H, m), 1.42 (3H, s), 1.40–0.84 (6H, m).

$^{13}$C-NMR (CDCl$_3$, 75 MHz) δ165.4, 129.8, 129.32, 86.6, 51.3, 46.6, 45.0, 40.6, 39.8, 32.4, 31.6, 31.2, 27.2, 25.5.

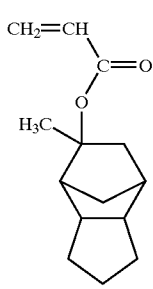

(I-2)

EXAMPLE 1

Synthesis of the Polymer Containing the Structure Unit of Formula (III)

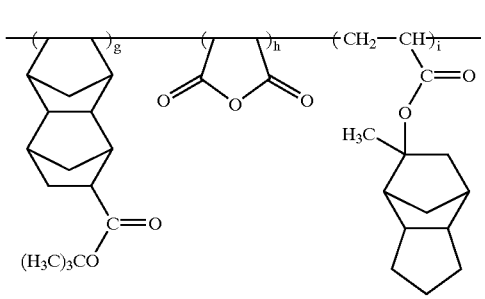

(III)

The initiator (4.92 g, 2,2'-azo-bis-isobutyronitrile; AIBN) is added to the mixture of tetrahydrofuran (60 ml), tert-butyl tetracyclo[4.4.0.1$^{2,5}$.1$^{7,12}$]dodec-3-ene-5-carboxylate (26 g), 8-methyl tricyclo[5.2.1.0$^{2,6}$]decan-8-yl acryloylate (23.4 g) and maleic anhydride (formula I-2, 9.8 g), then the mixture is heated to 70° C. and stirred overnight. Tetrahydrofuran (20 ml) is added to the mixture. After the resulted product mixture (20 ml) is added to 1 l of hexane dropwise and slowly, a white solid precipitate is obtained. The white solid is collected by filtration and dried to yield 30.23 g (51%) of the polymer containing the structure unit of formula (III), weight-average molecular weight 10875 (measured by GPC), glass transition temperature Tg=183° C., degradation temperature Td=212° C.

EXAMPLE 2

Synthesis of the Polymer Containing the Structure Unit of Formula (IV)

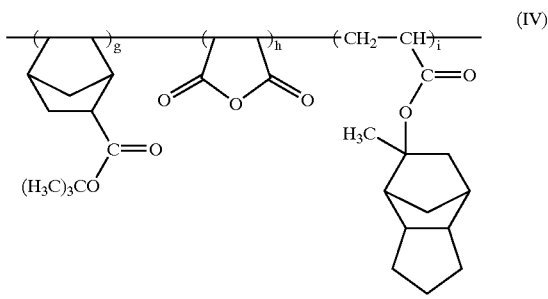

(IV)

The initiator (4.92 g, 2,2'-azo-bis-isobutyronitrile; AIBN) is added to the mixture of tetrahydrofuran (27 ml), tert-butyl tetracyclo[2.2.1]hept-2-ene-5-carboxylate (9.71 g), 8-methyl tricyclo[5.2.1.0$^{2,6}$]decan-8-yl acryloylate (11.7 g) and maleic anhydride (4.9 g), then the mixture is heated to 70° C. and stirred overnight. Tetrahydrofuran (20 ml) is added to the mixture. After the resluted mixture (20 ml) is added to 1,000 ml of hexane dropwise and slowly, a white solid precipitate is obtained. The white solid is collected by filtration and dried to yield 14.31 g (54.4%) of polymer containing the structure unit of formula (IV), weight-average molecular weight 9660 (measured by GPC), glass transition temperature Tg=180° C., degradation temperature Td=210° C.

EXAMPLE 3

Synthesis of the Polymer Containing the Structure Unit of Formula (V)

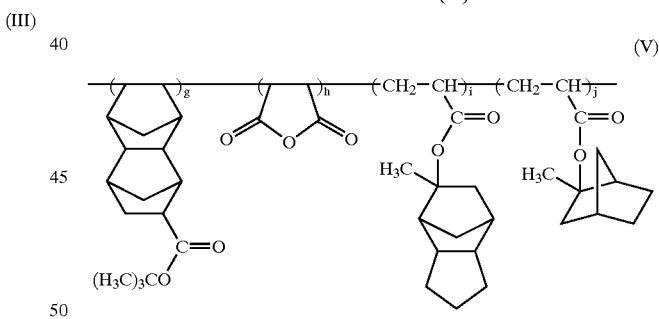

(V)

The initiator (4.92 g, 2,2'-azo-bis-isobutyronitrile; AIBN) is added to the mixture of tetrahydrofuran (28 ml), tert-butyl tetracyclo[4.4.0.1$^{2,5}$.1$^{7,12}$]dodecan-3-ene-5-carboxylate (6.5 g), 8-methyl tricyclo[5.2.1.0$^{2,6}$]decan-8-yl acryloylate (9.7 g), 2-methyl bicyclo[2.2.1]heptan-2-yl acrylate (6.16 g) and maleic anhydride (4.9 g), then the mixture is heated to 70° C. and stirred overnight. Tetrahydrofuran (20 ml) is added to the mixture. After 20 ml of the resulted mixture is added to 1,000 ml of hexane dropwise and slowly, a white solid precipitate is obtained. The white solid is collected by filtration and dried to yield 16.58 g (54.4%) of polymer containing the structure unit of formula (V), weight-average molecular weight 10428 (measured by GPC), glass transition temperature Tg=161° C., degradation temperature Td=208° C.

EXAMPLE 4

Synthesis of the Polymer Containing the Structure Unit of Formula (VI)

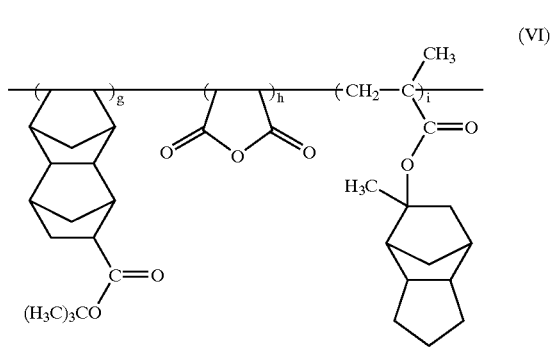

(VI)

The initiator (4.92 g, 2,2'-azo-bis-isobutyronitrile; AIBN) is added to the mixture of tetrahydrofuran (60 ml), tert-butyl tetracyclo[4.4.0.1$^{2,5}$.1$^{7,12}$]dodecan-3-ene-5-carboxylate (26 g), 8-methyl tricyclo[5.2.1.0$^{2,6}$]decan-8-yl acryloylate (23.4 g) and maleic anhydride (9.8 g). Then the mixture is heated to 70° C. and stirred overnight. Tetrahydrofuran (20 ml) is added to the mixture. After 20 ml of the resulted mixture is added to 1,000 ml of hexane dropwise and slowly, a white solid precipitate is obtained. The white solid is collected by filtration and then dried to yield 28.89 g (32%) of polymer containing the structure unit of formula (V), weight-average molecular weight 29810 (measured by GPC), glass transition temperature Tg=178° C., degradation temperature Td=209° C.

EXAMPLE 5

Synthesis of the Polymer Containing the Structure Unit of Formula (IIV)

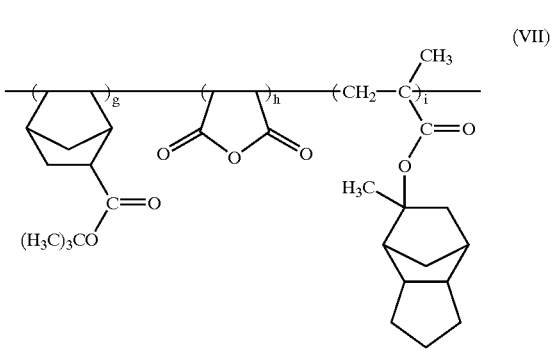

(VII)

The initiator (4.92 g, 2,2'-azo-bis-isobutyronitrile; AIBN) is added to the mixture of tetrahydrofuran (20 ml), tert-butyl tetracyclo[2.2.1]heptan-2-ene-5-carboxylate (9.71 g), 8-methyl tricyclo[5.2.1.0$^{2,6}$]decan-8-yl acryloylate(12.5 g) and maleic anhydride (4.9 g). Then the mixture is heated to 70° C. and stirred overnight. Tetrahydrofuran (20 ml) is added to the mixture. After 20 ml of the resulted mixture is added to 1,000 ml of hexane dropwise and slowly, a white solid precipitate is obtained. The white solid is collected by filtration and then dried to yield 11.25 g (46.3%) of polymer containing the structure unit of formula (VII), weight-average molecular weight 8379 (measured by GPC), glass transition temperature Tg=190° C., degradation temperature Td=213° C.

EXAMPLE 6

Synthesis of the Polymer Containing the Structure Unit of Formula (VIII)

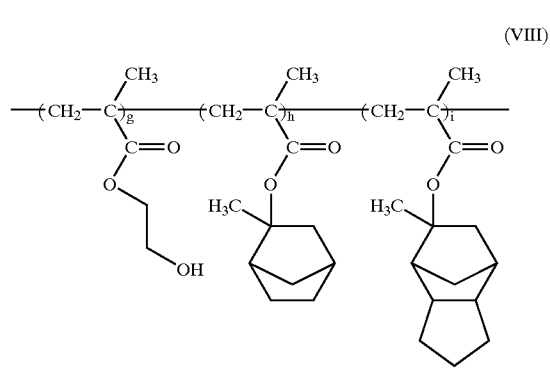

(VIII)

The initiator (4.92 g, 2,2'-azo-bis-isobutyronitrile; AIBN) is added to the mixture of tetrahydrofuran (27 ml), 8-methyl tricyclo[5.2.1.0$^{2,6}$]decan-8-yl acryloylate (11.7 g), 2-methyl bicyclo[2.2.1]heptan-2-yl acrylate (9.7 g) and 2-hydroxyethyl methacrylate (6.5 g). Then the mixture is heated to 70° C. and stirred overnight. Tetrahydrofuran (20 ml) is added to the mixture. After 20 ml of the resulted mixture is added to 1,000 ml of hexane dropwise and slowly, a white solid precipitate is obtained. The white solid is collected by filtration and then dried to yield 17.30 g (62.0%) of polymer containing the structure unit of formula (VIII), weight-average molecular weight 15632(measured by GPC), glass transition temperature Tg=175° C., degradation temperature Td=210° C.

APPLICATION EXAMPLE 9

Photoresist Composition

Triphenylsulfonium perfluoro-1-butanesul-fonate (TPS-PFBS, 0.05 g), tert-butyl cholate (TBC, 0.06 g), propylene glycol monomethyl ether acetate (10.4 g), polymer containing the structure unit of formula (III) (2 g, obtained from example 1) and N-(hydroxy methyl) piperidine (0.5 mg) are mixed together and filtered by a 0.45 μm filter. The resulted solution is spin coated on a silicon substrate by 2200 rpm for 30 sec.

The coated substrate is dried at 130° C. for 90 seconds. The thickness of the coating is 436.8 nm. The coated substrate is exposed under 193 nm, 10~30 mj/cm$^2$ deep UV radiation and then baked on heating plate at 130° C. for 90 sec.

The exposed coating is developed by an aqueous solution of 2.38% tetramethyl ammonium hydroxide (TMAH) After the coated substrate is washed by deionized water and dried, the exposed area shows a structure of resolution of 0.15 μm under the observation of scanning electronic microscopy (SEM).

The chemical amplified photoresist composition of the present invention can be used in lithography, especially 193 nm lithography. The resolution, shape and sensitivity of the resist pattern formed from the photoresist composition of the present invention are excellent.

From the foregoing description, one skilled in the art can easily ascertain the essential characteristics of this invention, and without departing from the scope thereof, can make various changes and modifications of the invention to adapt it to various usages and conditions. Thus, other embodiments are also within the claims.

What is claimed is:

1. A photosensitive polymer, which containing the structure unit of formula (II),

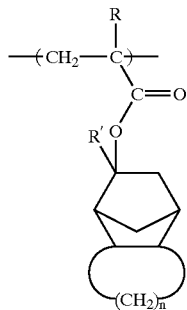

(II)

Wherein:
R is hydrogen or $C_1$–$C_4$ alkyl group; R' is $C_1$–$C_4$ alkyl group;
n is an integer of 2, 3, 4, 5 or 6.

2. The photosensitive polymer of claim 1, wherein R' is methyl group.

3. The photosensitive polymer of claim 1, wherein n is 3.

4. The photosensitive polymer of claim 1, wherein said photosensitive polymer contains a structure unit of formula (III)

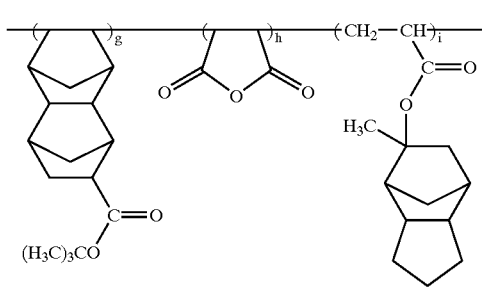

(III)

wherein g+h+i=1.

5. The photosensitive polymer of claim 4, wherein g/(g+h+i)=0.1–0.5, h/(g+h+i)=0.1–0.5, and i/(g+h+i)=0.1–0.5.

6. The photosensitive polymer of claim 1, wherein said photosensitive polymer contains a structure unit of formula (IV)

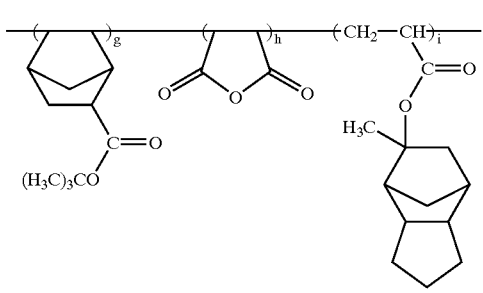

(IV)

wherein g+h+i=1.

7. The photosensitive polymer of claim 6, wherein g/(g+h+i)=0.1–0.5, h/(g+h+i)=0.1–0.5, and i/(g+h+i)=0.1–0.5.

8. The photosensitive polymer of claim 1, wherein said photosensitive polymer contains a structure unit of formula (V)

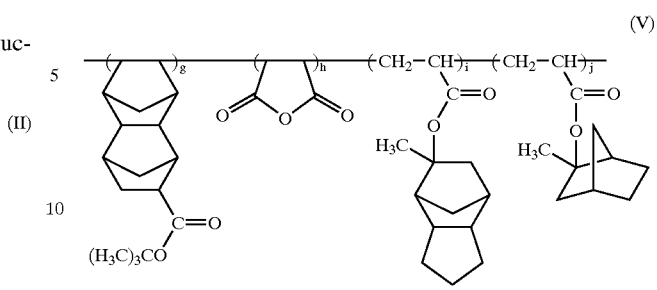

(V)

wherein g+h+i+j=1.

9. The photosensitive polymer of claim 8, wherein g/(g+h+i+j)=0.1–0.5, h/(g+h+i+j)=0.1–0.5, i/(g+h+i+j)=0.1–0.5, and j/(g+h+i+j)=0.1–0.5.

10. The photosensitive polymer of claim 1, wherein said photosensitive polymer contains a structure unit of formula (VI)

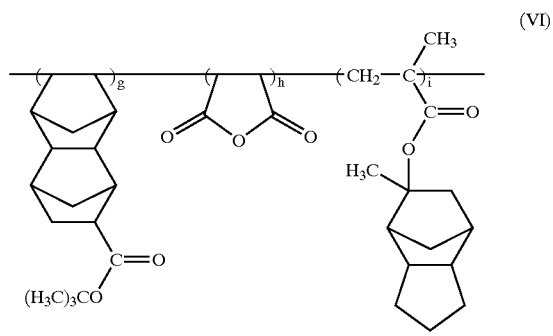

(VI)

wherein g+h+i=1.

11. The photosensitive polymer of claim 10, wherein g/(g+h+i)=0.1–0.5, h/(g+h+i)=0.1–0.5, and i/(g+h+i)=0.1–0.5.

12. The photosensitive polymer of claim 1, wherein said photosensitive polymer contains a structure unit of formula (VII)

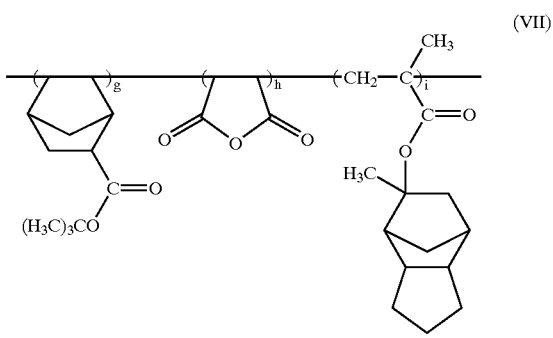

(VII)

wherein g+h+i=1.

13. The photosensitive polymer of claim 12, wherein g/(g+h+i)=0.1–0.5, h/(g+h+i)=0.1–0.5, and i/(g+h+i)=0.1–0.5.

14. The photosensitive polymer of claim 1, wherein said photosensitive polymer contains a structure unit of formula (VIII)

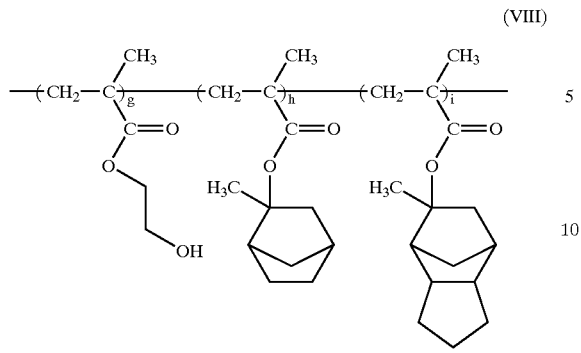

wherein g+h+i=1.

15. The photosensitive polymer of claim 14, wherein g/(g+h+i)=0.1–0.5, h/(g+h+i)=0.1–0.5, and i/(g+h+i)= 0.1–0.5.

16. The photosensitive polymer of claim 1, wherein the glass transition temperature Tg of said polymer ranges from 20° C. to 210° C., the weight-average molecular weight of the polymer ranges from 1,000 to 500,000, the degradation temperature Td of the polymer is greater than 80° C. and the polymer is soluble in organic solvent.

17. A photosensitive polymer, which is prepared by polymerizing or copolymerizing the following formula (I) compound:

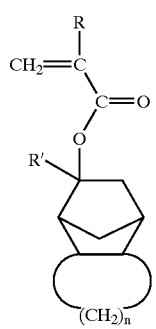

Wherein R is hydrogen or $C_1$–$C_4$ alkyl group; R' is $C_1$–$C_4$ alkyl group; n is an integer of 2, 3, 4, 5 or 6, with vinyl monomers.

18. The photosensitive polymer of claim 17, wherein R' is methyl group.

19. The photosensitive polymer of claim 17, wherein n is 3.

20. The photosensitive polymer of claim 17, wherein said vinyl monomers are selected from the group consisting of:

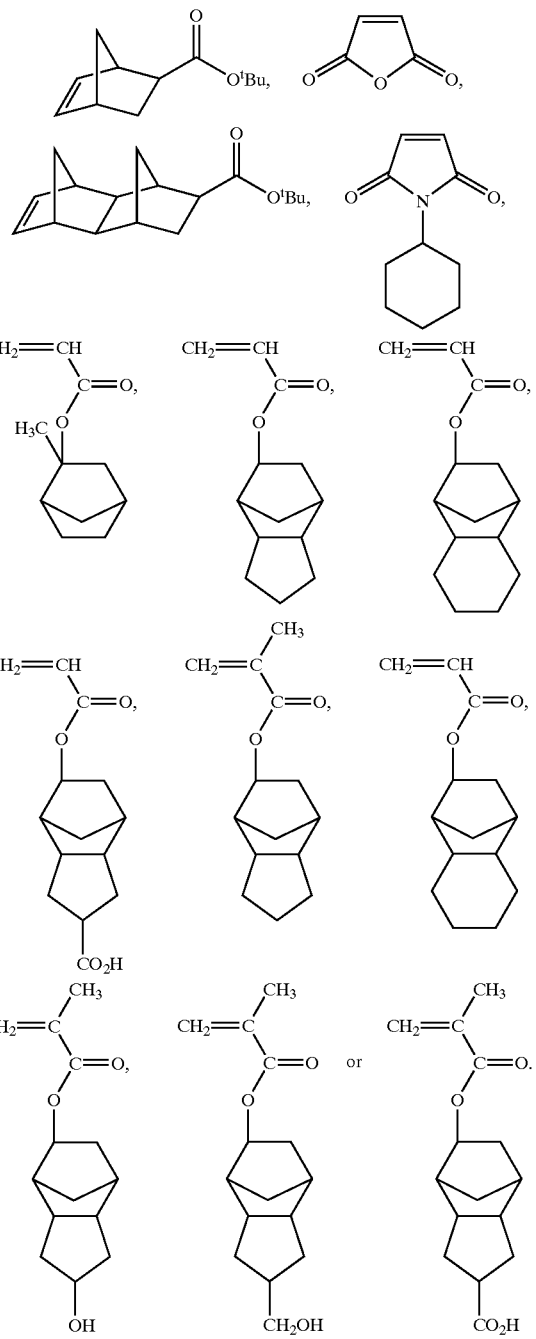

21. The photosensitive polymer of claim 17, wherein the glass transition temperature Tg of said polymer ranges from 20° C. to 210° C., the weight-average molecular weight of the polymer ranges from 1,000 to 500,000, the degradation temperature Td of the polymer is greater than 80° C. and the polymer is soluble in organic solvent.

22. The photosensitive polymer of claim 17, wherein the polymerization or copolymerization of said polymer is initiated by organic radical initiators or catalyzed by organometallic catalysts.

* * * * *